United States Patent [19]

Jouanny

[11] Patent Number: 4,668,037
[45] Date of Patent: May 26, 1987

[54] HERMETIC PASSAGE FOR AN ENCLOSURE, ESPECIALLY A HOUSING FOR SEMICONDUCTORS

[75] Inventor: Robert Jouanny, Montreuil-sous-Bois, France

[73] Assignee: Jeumont-Schneider Corporation, Puteaux, France

[21] Appl. No.: 535,417

[22] Filed: Sep. 26, 1983

[30] Foreign Application Priority Data

Sep. 30, 1982 [FR] France .................. 82 16429

[51] Int. Cl.$^4$ ............... H01R 13/74; H01B 17/30; H01J 5/32
[52] U.S. Cl. .................. 339/94 A; 174/31.5; 174/50.56; 339/126 RS
[58] Field of Search ............ 339/94 A, 94 R, 126 RS, 339/214 R, 214 C, 129; 174/18, 31.5, 50.56, 152 R, 153 R

[56] References Cited

U.S. PATENT DOCUMENTS 3,936,592 2/1976 Gamble .................. 174/153 R
4,053,693 10/1977 Münch et al. .................. 429/183

FOREIGN PATENT DOCUMENTS 2282586 3/1976 France .
2477774 9/1981 France .

Primary Examiner—Eugene F. Desmond
Assistant Examiner—Steven C. Bishop
Attorney, Agent, or Firm—Rines and Rines, Shapiro and Shapiro

[57] ABSTRACT

An electrical passage for an hermetic enclosure including electronic elements comprises a conducting piece (2) traversing an insulating sleeve (3) bearing on the inner surface (1) of the enclosure. A ring (7) surrounds the conducting piece (2) and a portion of the insulating sleeve (3) projecting outside of the enclosure, and a nut (13) inserted onto the conducting piece (2) ensures fastening of the assembly. A full ring seal (10) disposed between the inner surface (11) of the ring (7) and the outer surface (12) of the insulating sleeve (3) is compressed longitudinally by the outer wall (8) of the enclosure and by a shoulder (6) of the conducting piece, thus ensuring the hermeticity of the assembly. The tightening of the nut (13) acts on the insulating sleeve (3) within the enclosure. The invention has application to the electrical connection of power semiconductors utilized within the domain of railway traction.

4 Claims, 1 Drawing Figure

U.S. Patent  May 26, 1987  4,668,037
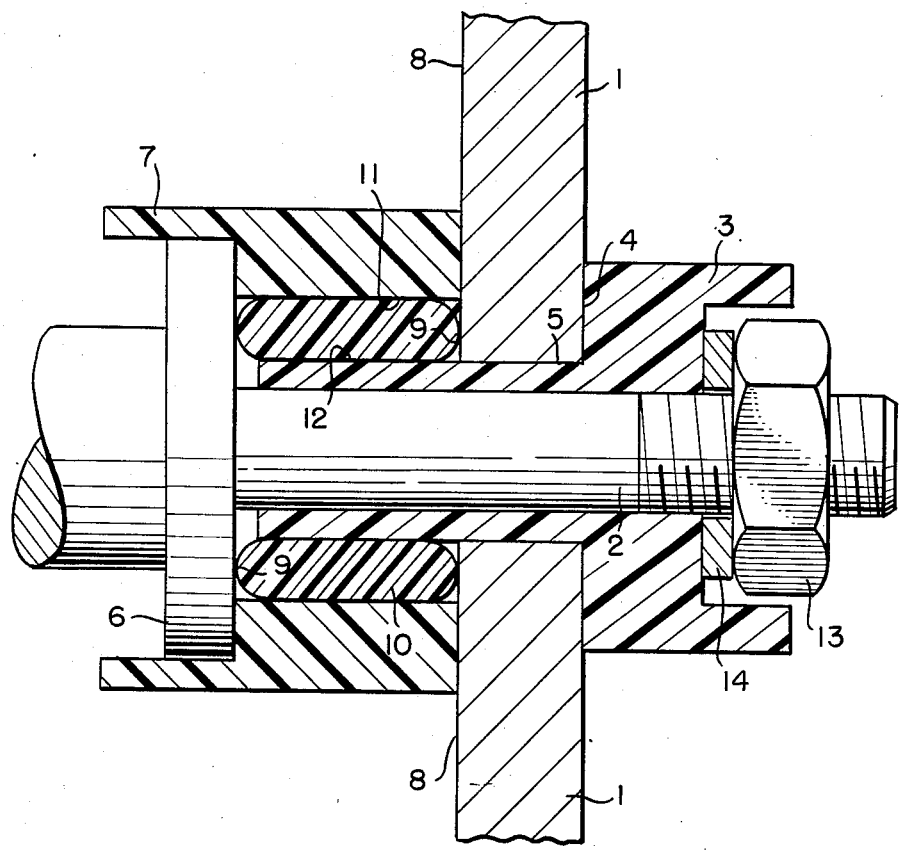

HERMETIC PASSAGE FOR AN ENCLOSURE, ESPECIALLY A HOUSING FOR SEMICONDUCTORS

The invention concerns an hermetic passage for an enclosure containing a fluid and one or more electronic elements, and more particularly the power semiconductors utilized especially in the domain of railway traction, with a view to the electrical connection of those elements.

The particularly severe operating conditions imposed, for example, by the use of a corrosive fluid for the intense cooling of a column of semiconductors, requires the utilization of a housing in which the semiconductors are enclosed. Significant differences of pressure and temperature between the interior and exterior of the housing necessitate the use of electrical connections which are hermetically sealed and resistant to the various harmful effects of the refrigerant employed. Familiar in particular from the French Pat. No. 2 477 774 is such an hermetic passage of a column of power semiconductors disposed within an enclosure. The design of this passage requires that at least one insulating piece be capable of resisting significant differences of pressure and temperature, and not be porous with respect to the enclosed fluid. The material utilized is rare and very costly. This design also requires the machining of recesses, the precision of which determines the effectiveness of the seal.

The invention thus has as its object to obviate these drawbacks by simplifying the design of the assembly and reducing the cost.

The present invention thus has as its object an hermetic passage for an enclosure containing a fluid and at least one element, such as a semiconductor, to be connected electrically to a terminal positioned outside of the enclosure. This passage comprises a conductive piece traversing an insulating sleeve bearing on the internal surface of the enclosure and projecting outward from it.

A ring surrounds the conducting piece and the portion of the insulating sleeve projecting outside of the enclosure. According to the invention, a full ring seal is placed between the inner surface of the ring and the outer surface of the portion of the insulating sleeve projecting outside of the enclosure, its two ends bearing respectively on the outer wall of the enclosure and on a shoulder of the conducting piece, and a nut is inserted onto the threaded portion of the conducting piece within the enclosure, with the tightening of this nut acting on the insulating sleeve through the intermediary of a locking washer.

The invention will be better understood, and other advantages, characteristics and goals of the invention will become more clear by reading the following description of one mode of realization, given in a non-limitational manner, to which description is appended a single drawing FIGURE.

This sole FIGURE represents a passage conforming to the present invention.

In accordance with the invention as shown in the drawing, an opening 5 has been made in a wall 1 of an enclosure containing the elements, for example a column of semiconductors (not shown). A conducting piece 2 traverses the wall 1 of the enclosure through this opening to achieve the electrical connection between the enclosed elements and an external terminal. It is surrounded by an insulating sleeve 3 which bears against the inner surface 4 of the enclosure, and is fitted within the opening in the enclosure. The conducting piece 2 has a shoulder 6. A ring 7 of insulating material bears laterally on the one hand on the outer surface 8 of the enclosure, and on the other hand on the shoulder 6 of the conducting piece 2. A full ring seal 10 is placed between the inner surface 11 of the ring 7 and the outer surface 12 of the portion of the insulating sleeve 3 projecting outside of the enclosure. The length of this full ring seal 10 is slightly greater than the distance separating the shoulder 6 of the conducting piece 2 and the outer surface 8 of the enclosure.

The ring thus constitutes a bridging piece between the conducting piece 2 and the enclosure, and permits a calculated longitudinal compression on the two flanks 9 of the full ring seal 10. The portion of the conducting piece 2 located within the enclosure is threaded to receive nut 13, in order, with the aid of the friction washer 14, to permit tightening of the entire assembly on the enclosure. The insulating sleeve 3 extends within the enclosure, surrounding the conducting piece 2, the nut 13 and the friction washer 14, to achieve a satisfactory electrical insulation between the assembly constituted by the conducting piece 2, the nut 13 and the washer 14, and the wall of the enclosure and to prevent any formation of an electric arc between a part under voltage and the wall. The ring 7 surrounds the conducting piece 2 over a sufficient length for the same reason.

In view of this manner of assembly, a number of advantages are apparent:

A single full ring seal 10 ensures the hermeticity of the passage. The porosity of the other parts used with respect to the fluid enclosure has no effect on the assembly.

The hermeticity does not depend on the precision of machining, since the full ring seal 10 is compressed between a number of pieces. It thus enables automatically taking up any play between the various pieces, and can compensate for any surface defects due to fabrication. The hermeticity depends solely on the ring 7 which regulates the compression of the ring seal 10.

The allowable porosity of the pieces used in this assembly permits a wide freedom in the choice of materials employed, and thus in the choice of means of fabrication of the pieces of the assembly, which can be molded or machined.

The tightening nut placed within the enclosure enables increasing the possibilities of external coupling of the passage.

Although only a single mode of realization of the invention has been described, it is obvious that any modification within the same spirit will not constitute a departure from the scope of the present invention.

I claim:

1. Apparatus providing a hermetic passage such as for an enclosure containing electronic components in a fluid, comprising an insulating sleeve passing through an opening in a wall of said enclosure, said sleeve having a first portion disposed within said enclosure and bearing against an inner surface of said enclosure and having a second portion projecting outside said enclosure; an insulating ring surrounding said second portion of said sleeve and having an inner surface spaced from an outer surface of said second portion of said sleeve; ring seal means disposed between said inner surface of said insulating ring and said outer surface of said second portion of said sleeve and having one end disposed to bearing against an outer surface of said enclosure; a conducting piece having an externally threaded end portion extending within said sleeve and freely disposed within said enclosure and having a shoulder disposed to bear against another end of said ring seal means; and a tightening nut disposed within said enclosure and threaded onto said end portion of said conducting piece such that tightening the nut causes said first portion of said sleeve to tighten said shoulder of said conducting piece against said another end of said ring seal means in order to longitudinally compress said ring seal means between said shoulder of said conducting piece and said outer surface of said enclosure.

2. Apparatus according to claim 1, wherein said insulating ring constitutes a bridging piece between said shoulder of said conducting piece and said outer surface of said enclosure, said ring being constructed to limit tightening of said shoulder against said another end of said ring seal means by abutment with said shoulder.

3. Apparatus according to claim 1, wherein said first portion of said sleeve surrounds said tightening nut.

4. Apparatus according to claim 1, including a friction washer carried on said end portion of the conducting piece intermediate said nut and said first portion of said sleeve.

* * * * *